United States Patent [19]

Sato et al.

[11] Patent Number: 4,862,071

[45] Date of Patent: Aug. 29, 1989

[54] HIGH SPEED CIRCUIT TESTING APPARATUS HAVING PLURAL TEST CONDITIONS

[75] Inventors: Kazuhiko Sato; Junji Nishiura; Keiichi Takahashi, all of Saitama

[73] Assignee: Advantest Corporation, Tokyo, Japan

[21] Appl. No.: 273,347

[22] Filed: Nov. 18, 1988

[30] Foreign Application Priority Data

Nov. 24, 1987 [JP] Japan .................................. 62-296995

[51] Int. Cl.$^4$ ....................... G01R 31/00; G06F 11/26
[52] U.S. Cl. .............................. 324/73 R; 324/158 R; 371/25; 371/21
[58] Field of Search ............ 324/73 R, 158 R, 73 AT; 371/25, 26, 21, 15, 16; 307/247.1, 445, 494, 362; 365/201

[56] References Cited

U.S. PATENT DOCUMENTS

4,414,665  11/1983  Kimura et al. ...................... 365/201
4,788,684  11/1988  Kawaguchi et al. ................. 371/25

Primary Examiner—Reinhard J. Eisenzopf
Assistant Examiner—Vinh P. Nguyen
Attorney, Agent, or Firm—Staas & Halsey

[57] ABSTRACT

Supplied with an output response signal from a circuit under test in each test channel, a level comparator compares the signal with a reference level which defines a normal logical level. The compared output is applied to two independent signal detectors, wherein it is detected and held at the timing of two strobe pulses which are provided thereto via two different signal lines at a desired time interval. These detected signals are applied to two logical comparators, wherein they are compared with expected value signals, respectively. An expected value signal switching circuit may be provided by which the expected value signal in this test channel and the expected value signal in another test channel are selectively provided to one of the logical comparators. It is also possible to adopt an arrangement in which test results read out of a plurality of storage areas of a failure analysis memory are provided as mask data to a desired one of the logical comparators to thereby mask its logical comparison.

18 Claims, 10 Drawing Sheets

HIGH SPEED CIRCUIT TESTING APPARATUS HAVING PLURAL TEST CONDITIONS

BACKGROUND OF THE INVENTION

The present invention relates to a circuit testing apparatus which is suitable for testing a digital circuit incorporated in a semiconductor integrated circuit element.

Figure 1:
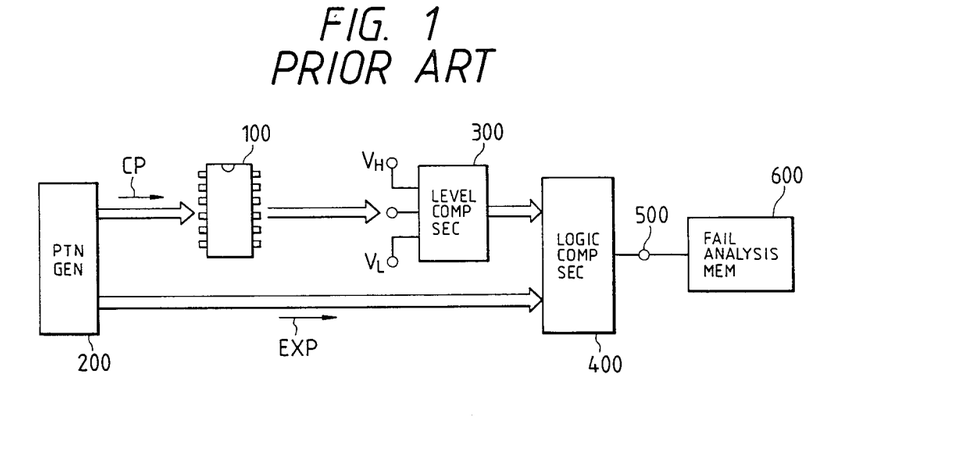
FIG. 1 is a block diagram of a conventional circuit testing apparatus.

FIG. 1 shows the entire arrangement of a conventional circuit testing apparatus. In FIG. 1 reference numeral 100 indicates a device under test (hereinafter referred to as a DUT) such as, for example, an LSI memory or logic circuit. The DUT 100 is supplied with a test pattern signal CP from a pattern generator 200. The pattern generator 200 yields, in addition to the test pattern signal CP, an expected value pattern signal EXP, which is applied to a logical comparison section 400 having a plurality of logic comparison channels. The logical comparison section 400 compares the expected value pattern signal EXP with an output response signal from the DUT 100 and provides a coincidence or noncoincidence signal to an output terminal 500. If necessary, the decided output is stored in a failure analysis memory 600 in preparation for a failure analysis.

In this testing apparatus, level comparison sections 300 of the same number as the number of pins of measuring input channels 301 are provided between the DUT 100 and the logical comparison section 400, although only one level comparison section 300 is shown in FIG. 1 for the sake of brevity. It is determined by the level comparison section 300 whether the level of each output response signal from the DUT 100 is above a specified voltage $V_H$ of an H-logic level or below a specified voltage $V_L$ of an L-logic level. This testing apparatus is adapted for detecting a failure of the DUT 100. Only when the output response signal is above the specified voltage $V_H$ or below the voltage $V_L$ is it considered that a specified logical output level is obtained at the terminal 301, and an L-logic signal is applied to the logical comparison section 400 for logical comparison.

The number of level comparison sections 300 and the number of channels of the logical comparison section 400 are equal to the total number of output terminals of the plurality of DUT's 100 which are measured at the same time. For simultaneously testing a plurality of IC's each having a large number of pins, such as LSI's, several hundreds of sets of level comparison sections 300 and logical comparison channels of the logical comparison section 400 are prepared.

To sort the DUT's 100 according to response speed, it is a general practice in the prior art to provide in the logical comparison section 400 a plurality of signal detectors for detecting the presence or absence of a logical decision output signal, supply them with strobe signals of different timing and determine the presence or absence of the logical decision output signal at the time point of application of the strobe signal. The conventional testing apparatus is arranged, for example, so that it can be determined whether each DUT is high or low in response speed, by detecting whether the logical decision output signal is yielded at the timing of an earlier or later strobe signal after application of a test pattern to the DUT.

Figure 2:
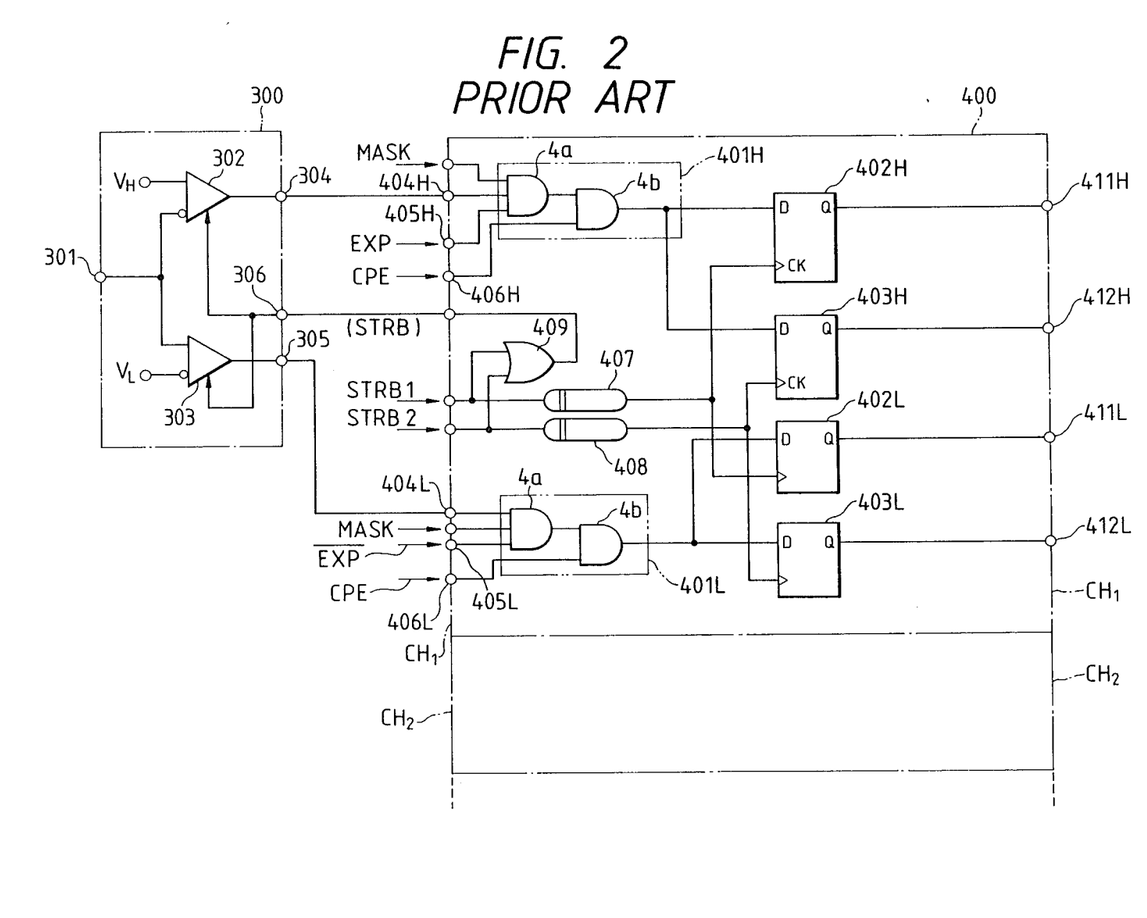
FIG. 2 is a circuit diagram of the level comparison section 300 and the logical comparison section 400 of the conventional circuit testing apparatus of FIG. 1.

FIG. 2 shows an example of such an arrangement. In FIG. 2, reference numeral 300 indicates the level comparison section and 400 the logical comparison section. The level comparison section 300 has two comparators 302 and 303 for one input terminal 301. An output response signal from the DUT 100 (see FIG. 1) to the input terminal is provided to one input terminal of each of the two comparators 302 and 303. The two comparators 302 and 303 are always supplied at the other input terminals with DC voltages $V_H$ and $V_L$ which define normal logical levels H and L, respectively. The comparators 302 and 303 compare the input signal level at the input terminal 301 with the voltages $V_H$ and $V_L$ at the timing of a strobe pulse STRB which is fed to a terminal 306, and hold the comparison results until application of the next strobe pulse. When the input signal level at the terminal 301 is higher than the voltage $V_H$, the comparator 302 determines that the input signal is at the normal H-logic level, and provides an L-logic signal to an output terminal 304. If the input signal level is not higher than the voltage $V_H$, then the comparator 302 will provide an H-logic signal to the terminal 304. When the input signal level at the input terminal 301 is lower than the voltage $V_L$, the comparator 303 decides that the input signal is at the normal L-logic level, and provides the L-logic signal to an output terminal 305. If the input signal level is not lower than the voltage $V_L$, then the comparator 303 will provide the H-logic signal to the terminal 305. That is to say, when the input signal is at the normal levels H and L, the L-logic signals are provided at the terminals 304 and 305, respectively. When it is decided that the input signal level is intermediate between the voltages $V_H$ and $V_L$, it is determined that the logical level of the input signal is undefined, and an H-logic signal is provided to both of the terminals 304 and 305. In other words, where the H-logic signals are concurrently provided to the terminals 304 and 305, the output response signal from the DUT does not meet the requirement of either logical level, indicating a failure of the DUT.

In each of channels $CH_1$, $CH_2$, $CH_3$, ... of the logical comparison section 400 there are provided an H-logic comparator 401H, an L-logic comparator 401L and pluralities of H-logic system signal detectors 402H and 403H and L-logic system signal detectors 402L and 403L for detecting at which timing the logical comparators 401H and 401L yield their outputs. In this example, each system is shown to include two signal detectors.

The logical comparators 401H and 401L can each be formed by a coincidence detect AND gate 4a and a comparison enable AND gate 4b, for instance. The logical comparators 401H and 401L are supplied at their input terminals 404H and 404L with output response signals from the terminals 304 and 305 of the level comparison section 300 and at their input terminals 405H and 405L with expected value signals EXP and $\overline{\text{EXP}}$ and each detect, by the AND gate 4a, coincidence in the H logic between the output response signal and the expected value signal. The coincidence in the H logic indicates that the signal applied to the input terminal 301 of the level comparison section 300 does not have the specified level. Let it be assumed, here, that each AND gate 4a is being supplied with H-logic mask data. Furthermore, a control signal CPE is applied via other input terminals 406H and 406L to the AND gates 4b to permit or inhibit the passage therethrough of the results of logical comparison. Since the level comparator 303 provides the L-logic signal at its output terminal 305 when detecting the L-logic level of the input signal, the expected value signal which is applied to the terminal 405L is an inverted version of the expected value signal EXP which is applied to the terminal 405H, that is, $\overline{\text{EXP}}$. When detecting coincidence in the H logic between the expected value signal EXP or $\overline{\text{EXP}}$ and the input response signal, the AND gate 4a outputs the H-logic signal.

The logical decision output signals in these H-logic and L-logic systems are provided to data input terminals D of the pairs of signal detectors 402H, 403H and 402L, 403L which are formed by D-type flip-flops, for instance. The signal detectors 402H, 403H and 402L, 403L detect whether the logical decision output signals are present or not at the timing defined by strobe pulses STRB 1 and STRB 2 which are applied to their clock input terminals CK, respectively. Reference numerals 407 and 408 indicate delay elements, by which the strobe pulses STRB 1 and STRB 2 are delayed so that the outputs of the logical comparators 401H and 401L are supplied to the D-type flip-flops 402H, 403H and 402L, 403L a predetermined period of time after the timing of the level comparison in the level comparison section 300, taking into account a delay in the operation of the logical comparators 401H and 401L. The strobe pulses STRB 1 and STRB 2 are provided via an OR gate 409 to the comparators 302 and 303 which constitute the level comparison section 300.

Now, let it be assumed that the strobe pulse STRB 1, for example, is generated earlier than the other strobe pulse STRB 2 by a predetermined time. The level comparators 302 and 303 compare the input signal level with the voltages $V_H$ and $V_L$, first at the timing of the strobe pulse STRB 1 and hold the results of comparison, which are provided to the flip-flops 402H and 402L by the strobe pulse STRB 1 delayed by the delay element 407. Next, the level comparators 302 and 303 perform the level comparison at the timing of the strobe pulse STRB 2 and the results of comparison are provided to the flip-flops 403H and 403L by the strobe pulse STRB 2 similarly delayed by the delay element 408. The logical test results thus provided to the flip-flops 402H, 403H, 402L and 403L are written via terminals 411H, 412H, 411L and 412L into corresponding storage areas of the failure analysis memory 600 shown in FIG. 1. Though not shown, in the actual testing apparatus D-type flip-flops are provided for writing the outputs of the flip-flops 402H, 403H, 402L and 403L in synchronism with the operating clock of the testing apparatus. Of such synchronized output data, corresponding outputs of the H-logic and L-logic systems are ANDed by AND circuits (not shown), and when the AND is H-logic, it is determined that the response output of the DUT is a failure. However, the circuits associated with this are not related to the subject matter of the present invention, and hence are not shown.

Figure 3:
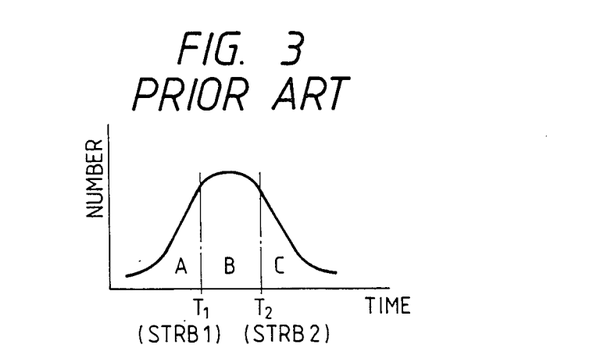
FIG. 3 is a graph, for explaining a method of classifying circuits under test by the conventional circuit testing apparatus.

With the provision of the plurality of signal detectors 402H, 403H, 402L and 403L, it is possible to determine whether the operation of the DUT 100 is normal or not and to classify the response speed distribution of many DUT's 100 into a plurality of regions. Now, assume that the timing for generating the strobe pulses STRB 1 and STRB 2 is set to $T_1$ and $T_2$. By testing the DUT's 100 on the basis of the timing $T_1$ and $T_2$, they can be classified into a high response region A, a normal response speed region B and a low response speed region C as shown in FIG. 3. For example, in the case of the H-logic system, when the logical determination output signals loaded into the flip-flops 402H and 403H by the strobe pulses STRB 1 and STRB 2 are both H-level, it is seen that the DUT 100 belongs to the high response speed region A. When the logical determination output signals loaded into the flip-flops 402H and 403H by the strobe pulses STRB 1 and STRB 2 are L-level and H-level, respectively, it is seen that the DUT 100 belongs to the normal response speed region B. When the logical determination output signals loaded into the flip-flops 402H and 403H are both L-level, it is seen that the DUT 100 belongs to the low response speed region C. This classification can be performed using logical signals which are provided at the output terminals 411H and 412H. A similar test can also be made for the L-logic system.

In the arrangement shown in FIG. 2, the two strobe pulses STRB 1 and STRB 2 of different timing are superimposed on each other by the OR gate 409 into one time series signal, which is applied to the level comparators 302 and 303. Therefore, the time interval between the strobe pulses STRB 1 and STRB 2 is limited to 10 nanoseconds or more owing to the circuit structure of the OR gate 409. If they are generated at a shorter time interval, they will combine into a single pulse, making it impossible to detect the rise and fall of the response output signal belonging to the region B depicted in FIG. 3.

Recently storage elements have been rendered high-speed and some of them rise in as short a time as 10 to 25 nanoseconds. For testing such quick response type elements, the two strobe pulses STRB 1 and STRB 2 must be generated at time intervals of 2 to 5 nanoseconds. However, the conventional method cannot afford such a reduction of the time interval between the strobe pulses. Therefore, quick response type memories cannot be classified by one test for each memory and at least two tests must be made for each memory while changing the setting of the timing for generating the strobe pulses.

On the other hand, when some of the DUT's 100 output signals of periods shorter than the operation cycle of the testing apparatus, they must be tested in addition to the test for classifying them according to their response speed. The prior art employs a pin multiplex system for such a test.

Figure 4:
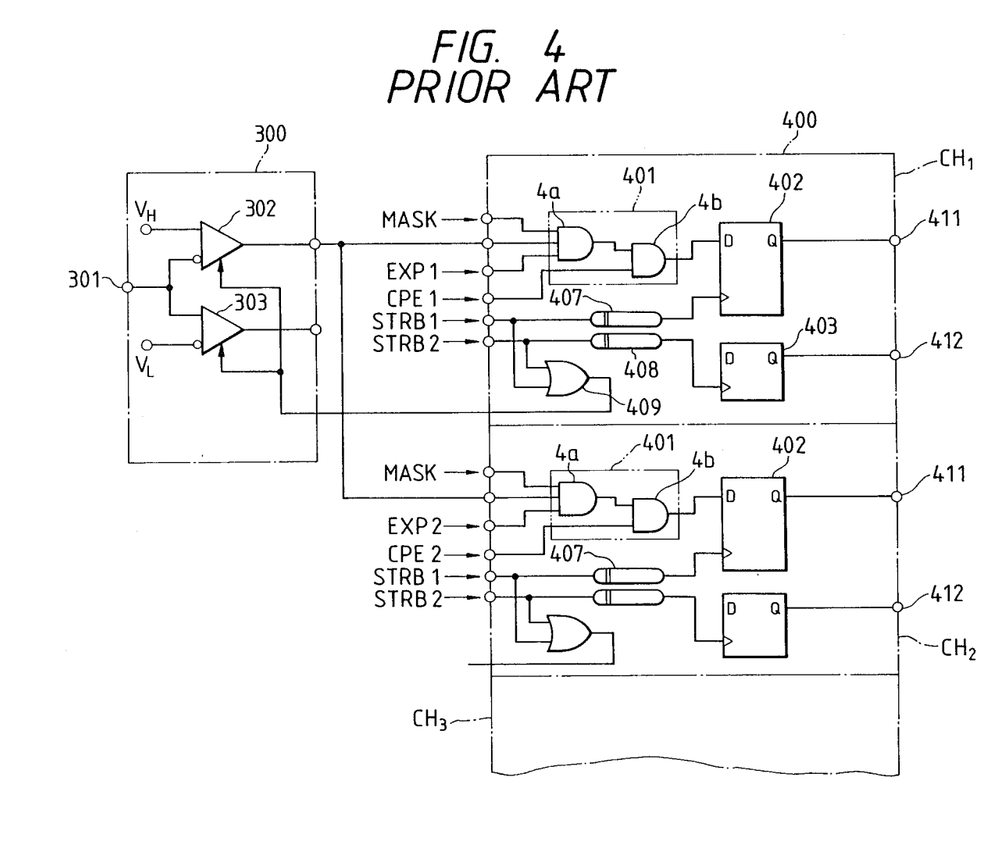
FIG. 4 is a circuit diagram used to explain the operation of a multiplex system of the conventional circuit testing apparatus.

According to the pin multiplex system, as shown in FIG. 4, the output signal of the level comparison section 300 is applied to the logical comparators 401 provided in a plurality of channels, for example, two channels $CH_1$ and $CH_2$, and in the plurality of logical comparators 401 the output signal is subjected to the logical comparison with expected value signals EXP 1 and EXP 2 of a normal cycle speed. The results of comparison are provided to the signal detectors 402 provided in the respective channels $CH_1$ and $CH_2$, thereby detecting the presence or absence of signals at the timing of the strobe pulses STRB 1 and STRB 2. While in FIG. 4 the logical comparison section 400 is shown to include the channels of the H-logic system alone, the L-logic system is also provided in practice as is the case with FIG. 2.

Figure 5:
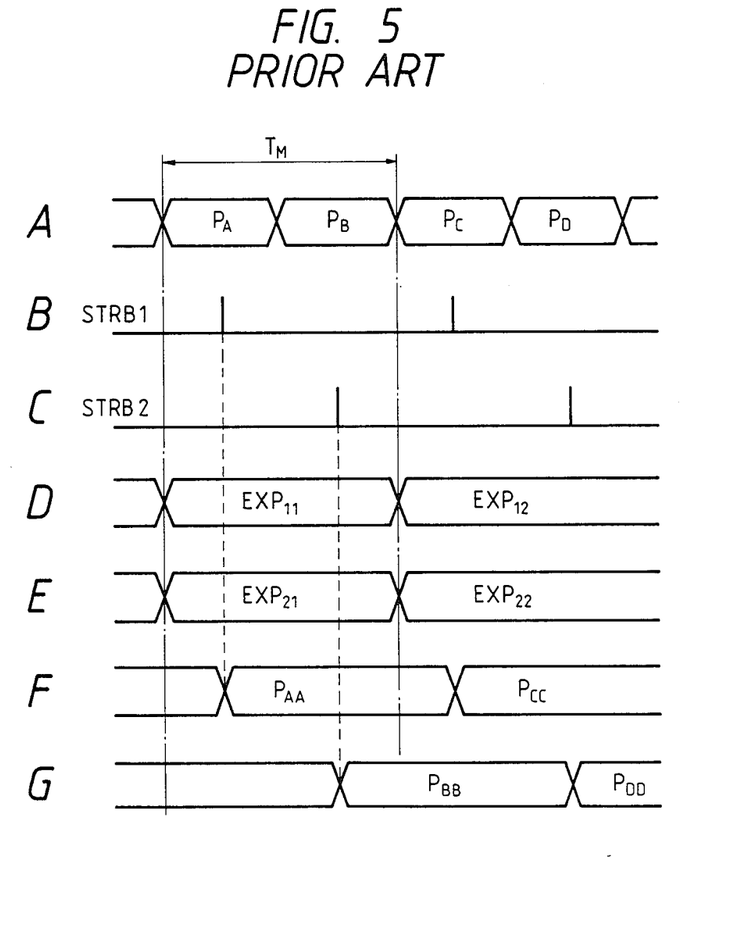
FIG. 5 is a waveform diagram used for explaining the operation of the multiplex system.

According to the pin multiplex system, assuming that the DUT 100 outputs response signals $P_A$, $P_B$, $P_C$, $P_D$, . . . which vary, for instance, twice in one test cycle $T_M$ as depicted in FIG. 5A, the output response signals $P_A$, $P_B$, $P_C$, $P_D$, . . . are applied via the level comparison section 300 to the logical comparators 401 provided in the two channels $CH_1$ and $CH_2$.

The logical comparators 401 are supplied at one input with expected value signals $EXP_{11}$, $EXP_{12}$, . . . and $EXP_{21}$, $EXP_{22}$, . . . which vary at a normal speed (i.e.

with the period $T_M$) as shown in FIGS. 5D and 5E, respectively. Further, the logical comparators 401 are supplied at another input with signals CPE 1 and CPE 2 which control whether or not to perform the logical comparison. The output response signals $P_A$, $P_B$, $P_C$, $P_D$, ... of the speed twice higher than the normal speed and the expected value signals $EXP_{11}$, $EXP_{12}$, ... and $EXP_{21}$, $EXP_{22}$, ... in the two systems are compared by the logical comparators 401 in the different channels. The results of comparison are provided to the signal detectors 402 in the respective channels.

The signal detectors 402 are supplied with the strobe pulses STRB 1 and STRB 2 depicted in FIGS. 5B and 5C, respectively. The signal detectors 402 provide at an output terminal 411 of the channel $CH_1$ such logical decision output signals $P_{AA}$, $P_{CC}$, $P_{EE}$, ... as shown in FIG. 5F, and at an output terminal 411 of the channel $CH_2$ such logical decision output signals $P_{BB}$, $P_{DD}$, $P_{FF}$, ... as depicted in FIG. 5G. Thus, the logical decision output signals $P_{AA}$, $P_{CC}$, $P_{EE}$, ... and $P_{BB}$, $P_{DD}$, $P_{FF}$, ... are of the normal speed of the testing apparatus and can be written into the failure analysis memory and utilized for various analyses.

Since the pin multiplex system utilizes the plurality of channels $CH_1$ and $CH_2$ for the output response signal from one output terminal of the DUT, this system is defective in that the number of channels used needs to be a multiple of the number of operation cycles of the DUT relative to that of the testing apparatus. That is, it is necessary to provide channels of a number at least twice that of output terminals of the DUT; this inevitably enlarges the scale of the apparatus and raises its manufacturing costs.

Furthermore, in a failure analysis of memories, for example, the situation occasionally arises where it would be desirable to sort individual memory cells according to varied test conditions. For instance, there is the case where it is desirable to sort the cells according to whether or not they meet the condition of an access time b, the cells which meet the condition of the access time b but do not meet the condition of an access time c (where c <b), and the cells which meet the condition of the access time c but do not meet the condition of an access time d (where d <c).

In such sorting, if the access times b, c and d are, for example, 35, 30 and 25 nanoseconds, respectively, then the conventional testing apparatus shown in FIG. 2 cannot use the strobe pulses STRB 1 and STRB 2 at the time interval of 5 nanoseconds. It is therefore necessary to perform logical comparisons test by use of the strobe pulse STRB 1 alone, without using the strobe pulse STRB 2, and conduct the tests one by one while changing the timing of the strobe pulse STRB 1 for each of the test conditions. Accordingly, in the prior art the test must be carried out four times as described below in connection with one channel.

First Measurement

Figure 6:
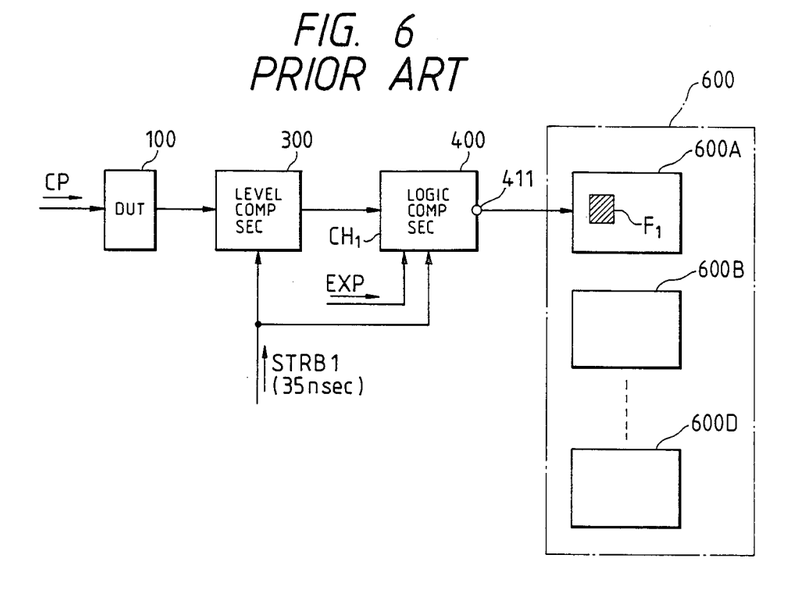
FIGS. 6, 7, 8 and 9 are block diagrams, used for explaining a method for classifying operation characteristics of a circuit under test by the conventional circuit testing apparatus.

As shown in FIG. 6, the strobe pulse STRB 1, which is applied to, for example, the channel $CH_1$ of the level comparator 300 and the logical comparison section 400, is set, as the test condition b, to timing of 35 nanoseconds relative to the application of a test pattern CP (an address in this case), and the test is made under the condition b. Where the response from the memory cell of the memory under test 100, specified by each address, meets the test condition b, an L-logic signal is provided to the output terminal 411 of the logical comparison section 400, and when the response from the memory cell does not meet the test condition b, an H-logic signal is provided to the output terminal 411. This data is written into a storage area 600A of the failure analysis memory 600 at the address position corresponding to the address. The positions of the cells which have failed to meet the test condition b, that is, the positions where H has been written, are each indicated at the corresponding position in the storage area 600A of the failure analysis memory 600, for example, at a failure area $F_1$.

Second Measurement

Figure 7:
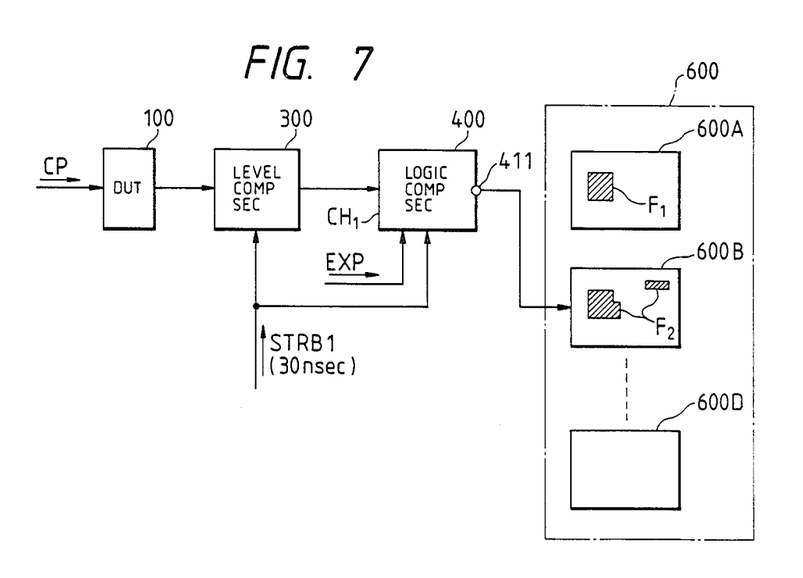

As the test condition c, the strobe pulse STRB 1 which is applied to the level comparison section 300 and the logical comparison section 400 is set to timing of 30 nanoseconds relative to the application of the test pattern CP, as shown in FIG. 7, and the same memory 100 is tested under the condition c. Data on each memory cell, obtained by this test, is stored at the corresponding position in a storage area 600B of the failure analysis memory 600, for instance, in a failure area indicated by $F_2$.

Third Measurement

Figure 8:
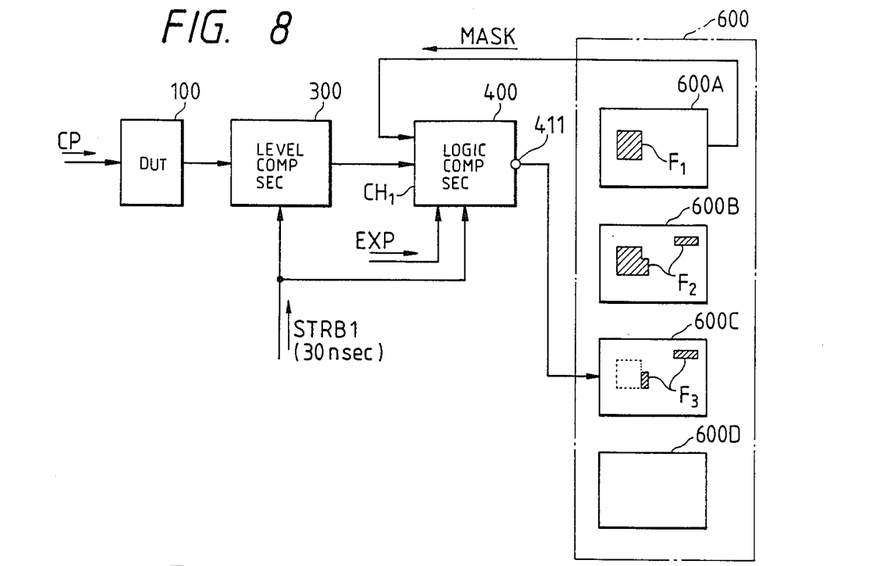

As shown in FIG. 8, the strobe pulse STRB 1 which is applied to the level comparison section 300 and the logical comparison section 400 is set to the same timing of 30 nanoseconds as in the second measurement, and the same memory is tested under the condition c. In this case, the test data for the condition b corresponding to each memory cell of the memory under test, stored in the storage area 600A of the failure analysis memory 600, is read out therefrom and inverted in its logic to obtain mask data MASK, which is provided to the logical comparison section 400. Accordingly when the data read out of the storage area 600A is of the H-logic level indicating that the corresponding memory cell of the memory under test does not meet the condition b, mask data MASK of the L-logic level is provided to the logical comparator 401 in the logical comparison section 400 (see FIG. 2), disabling the gate 4b, i.e. inhibiting the logical comparison at that time. Of the memory cells which met the condition b, those which do not meet the condition c as mentioned above are stored at the corresponding positions in a storage area 600C of the failure analysis memory 600, as indicated by a failure area $F_3$.

Fourth Measurement

Figure 9:
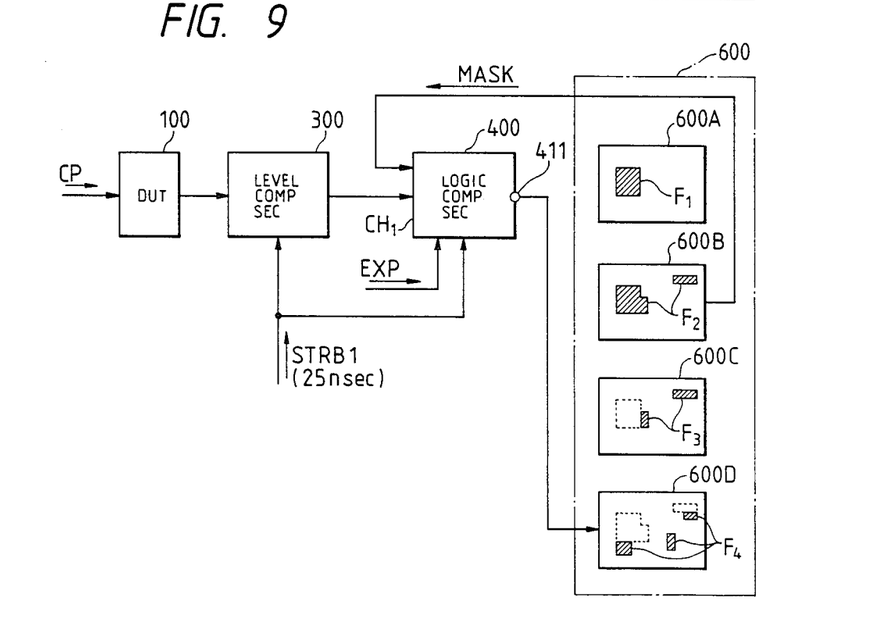

As shown in FIG. 9, the strobe pulse STRB 1, which is applied to the level comparison section 300 and the logical comparison section 400, is set to timing of 25 nanoseconds, as a test condition d, and the same memory 100 is tested under the condition d. In this instance, the test data for the condition c is read out of the storage area 600B of the failure analysis memory 600 and its inverted output is applied as mask data MASK to the logical comparison section 400, masking the cells which did not meet the condition c. The positions of cells which do not meet the condition d are stored at the corresponding positions in a storage area 600D of the failure analysis memory 600 as indicated by a failure area $F_4$.

By making the tests under the conditions b, c and d in four stages as described above, positional information of the cells which met the test condition b but did not meet the test condition c can be obtained in the storage area 600C of the failure analysis memory 600 and positional information of the cells which met the test condition c but did not meet the test condition d can be obtained in the storage area 600D of the failure analysis memory 600.

As described above, the prior art involves testing for each of the conditions b, c and d in the case of sorting the access time of a quick response type memory, and hence consumes much time therefor.

SUMMARY OF THE INVENTION

It is therefore an object of the present invention to provide a circuit testing apparatus which permits a correct logical comparison even if the time intervals between the strobe pulses are set close to each other as desired.

Another object of the present invention is to provide a circuit testing apparatus which permits testing a circuit of a high operation cycle speed, without the need of increasing the number of input-terminal pins used.

Yet another object of the present invention is to provide a circuit testing apparatus which permits testing of circuits in a short time even if various test conditions are imposed.

According to an aspect of the present invention, the circuit testing apparatus includes: a plurality of signal detecting means provided in each test channel, for comparing an output response signal from a circuit under test with a reference level defining a normal logical level, at arbitrary timing to thereby detect whether or not the output response signal is at the normal logical level; a plurality of independent strobe signal lines for individually supplying the plurality of signal detecting means with strobe pulses for determining the timing of the level comparison; and a plurality of logical comparison means which are supplied with signals detected by the plurality of signal detecting means, for making a logical comparison between them and an expected value signal to detect coincidence or noncoincidence therebetween.

With such an arrangement, since the strobe pulses on the plurality of signal lines can be provided at close timing, even quick response type circuits can be classified by one test according to response time.

According to another aspect of the present invention, a switching circuit is provided by which the expected value signal, which is applied to at least one of the plurality of logical comparison means of each channel, is exchanged for the expected value signal which is applied to another channel. With the provision of this switching circuit, even if the circuit under test yields a response signal of a period which is an integral fraction of one test cycle of the circuit testing apparatus, the comparison of its logical level can be achieved by timing the strobe pulses to a plurality of response signal cycles in each test cycle by the plurality of signal detecting means in the same channel. Accordingly, the circuit under test can be tested at a speed several times higher than the operating speed of the circuit testing apparatus without using the conventional pin multiplex system.

According to yet another aspect of the present invention, a signal multiplexer circuit may be provided by which test data read out of a desired storage area of the failure analysis memory can be provided as mask data to a desired one of the plurality of logical comparison means. With the provision of this signal multiplexer circuit, quick response type memories or the like can be classified, with excellent resolution, according to response speed. Moreover, since mask data can be provided separately from a plurality of storage areas of separately provided failure analysis memories to a plurality of logical comparison sections, it is possible to obtain test data on a plurality of test conditions by one test.

DESCRIPTION OF THE PREFERRED EMBODIMENTS

Figure 10:
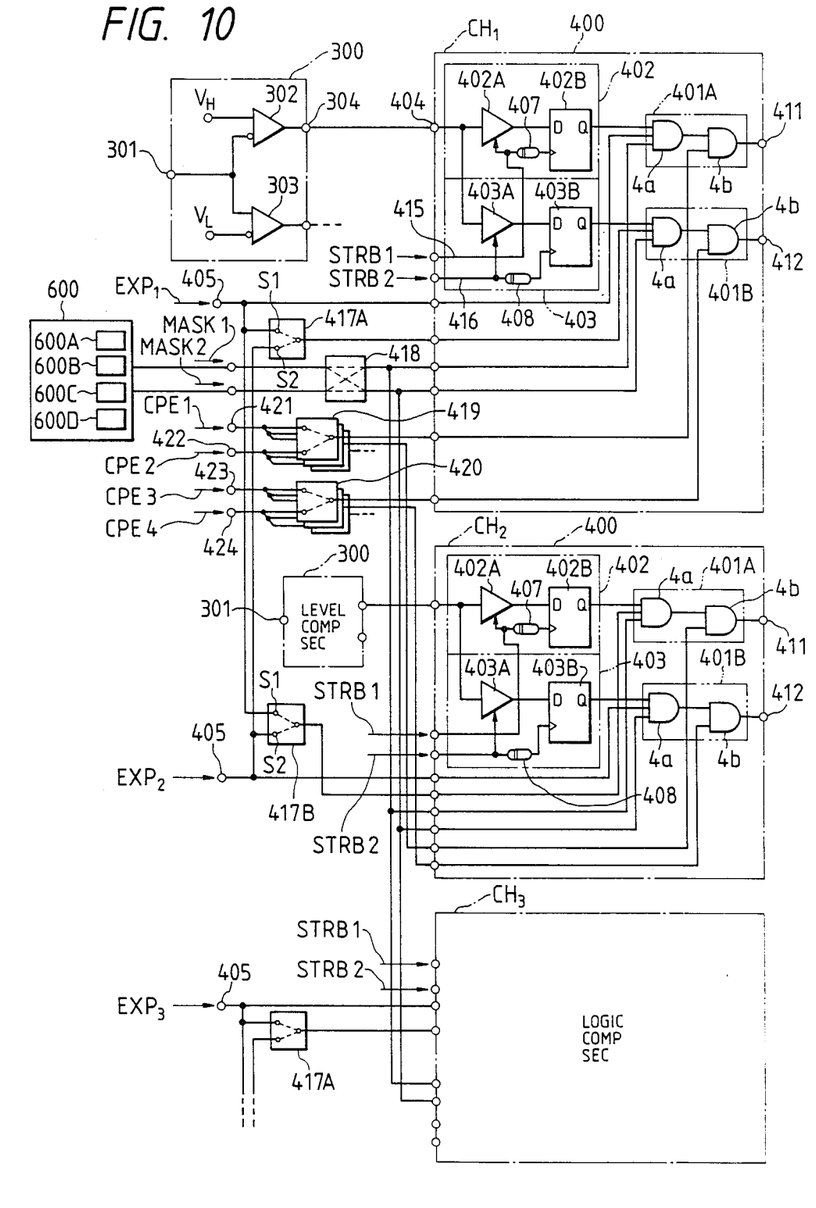
FIG. 10 is a block diagram of an embodiment of the present invention.

FIG. 10 illustrates an embodiment of the present invention. Reference numeral 300 indicates level comparison sections, each of which is supplied at the input terminal 301 with an output response signal from a circuit under test (not shown). In the level comparison section 300 it is always decided, by comparison, whether the H logical level and the L logical level of the response signal are normal or not.

The thus level-decided response signal from each level comparison section 300 is applied to one of channels $CH_1$, $CH_2$, ... corresponding to each logical comparison section 400. In the channels $CH_1$, $CH_2$, ... of the logical comparison sections 400 the response signal is compared with expected value data $EXP_1$, $EXP_2$, ... for detecting coincidence or noncoincidence therebetween.

In the present invention, a plurality of signal detectors 402 and 403 and a plurality of logical comparators 401A and 401B are provided in the logical level system of each channel of the logical comparison section 400. The signal detectors 402 and 403 detect the presence of the response signal, using the strobe pulses STRB 1 and STRB 2 which are supplied thereto via different signal lines 415 and 416. In the case of making such a response speed test as described previously with regard to FIG. 3, signal switching circuits 417A and 417B are connected to S1 and S2 sides, respectively, and the detected outputs from the signal detectors 402 and 403 are applied to the logical comparators 401A and 401B, wherein they are compared with the expected value signals EXP$_1$, EXP$_2$, EXP$_3$, ... corresponding to the channels.

While in FIG. 10 the signal detectors 402 and 403 and the logical comparators 401A and 401B are shown in the H logical system alone, it is a matter of course that a similar arrangement is also provided in the L logical system as mentioned previously in connection with FIG. 2.

In this example, the signal detectors 402 and 403 can be made up of sampling circuits 402A and 403A and D-type flip-flops 402B and 403B, respectively. The sampling circuits 402A and 403A hold the input signal levels in response to the strobe pulses STRB 1 and STRB 2 which are applied to their strobe input terminals via different signal lines 415 and 416, and their outputs are applied to data input terminals D of the D-type flip-flops 402B, and 403B. The strobe pulses STRB 1 and STRB 2 are also provided via delay circuits 407 and 408 to clock input terminals CK of the D-type flip-flops 402A and 403B, respectively, latching therein the outputs of the sampling circuits 402A and 403A.

The output terminal of each of the D-type flip-flops 402B and 403B is connected to one input terminal of an AND gate 4a constituting each logical comparator 401. The AND gates 4a in each channel are each supplied at another input terminal with the expected value signal EXP from an input terminal of the channel, and it is determined whether or not each response signal coincides with the expected value signal.

Furthermore, according to the present invention, at least two signal switching circuits 417A and 417B are provided every two channels, by which either one of the expected value signals EXP$_1$ and EXP$_2$ can selectively be applied to the one logical comparator 401A and the other logical comparator 401B of two channels. For example, in the case of such a response speed test as mentioned previously, the signal switching circuits 417A and 417B are connected to the S1 and S2 sides, respectively, so that the same expected value signal EXP$_1$ is applied to both of the logical comparators 401A and 401B of the channel CH$_1$ and the same expected value signal EXP$_2$ is applied to both of the logical comparators 401A and 401B of the channel CH$_2$. In the case of the logical test of circuits which operate at a speed twice higher than the operation cycle of the testing apparatus, the switching circuits 417A and 417B are connected to the S2 and S1 sides, respectively, by which the expected value signals EXP$_1$ and EXP$_2$ are applied to the logical comparators 401A and 401B of the channels CH$_1$ and CH$_2$.

According to the present invention, a mask data multiplexer may also be provided in association with the plurality of logical comparators 401A and 401B of each channel so that mask data read out of the failure analysis memory 600 can be provided to a desired one of the logical comparators. The failure analysis memory 600 has a plurality of storage areas 600A, 600B, 600C and 600D, and the mask data multiplexer 418 sets which logical comparator is supplied with mask data read out of the storage areas. With the provision of the mask data multiplexer 418, it is possible to select which of the logical comparators 401A and 401B of each channel is to be supplied with the mask data read out of the storage areas 600A to 600D of the failure analysis memory 600.

Reference numerals 419 and 420 designate similar signal switching circuits, by which signals CPE1, CPE2, CPE3 and CPE4 for controlling whether or not to perform the logical decision, applied to terminals 421, 422, 423 and 424, are selected and applied to AND gates 4b of each channel, setting the logical comparators 401A and 401B to a state in which one or both of them perform or do not perform the logical decision.

Figure 11:
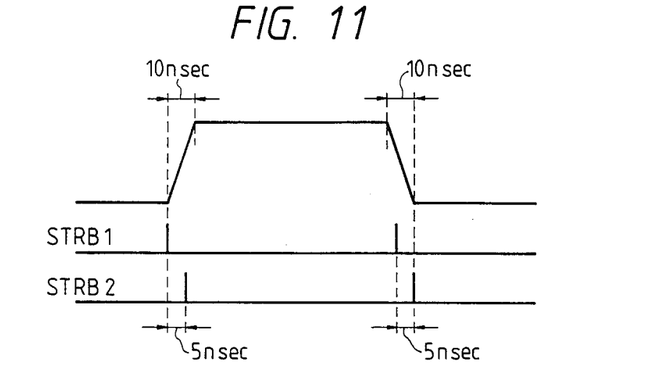
FIG. 11 is a waveform diagram, for explaining a mode of operation of the present invention.

Since the independent strobe pulses STRB 1 and STRB 2 are applied to the signal detectors 402 and 403 via the different signal lines as referred to above, even if the strobe pulses STRB 1 and STRB 2 are provided at close timing in the test of the response characteristic of the circuit under test, the signal detectors 402 and 403 can detect, without interference with each other, the presence or absence of the rise or fall of the response signal of the circuit under test within a range of an extremely short time difference. Accordingly, even in the case of a response signal of a quick response type circuit which rises up in 10 nanoseconds or so, the presence or absence of its rise can be detected with high resolution by setting the time difference between the strobe pulses STRB 1 and STRB 2 to about 5 nanoseconds, as shown in FIG. 11. As a result of this, the response speed of a quick response type circuit can be measured and classified with high resolution by one test.

Figure 12:
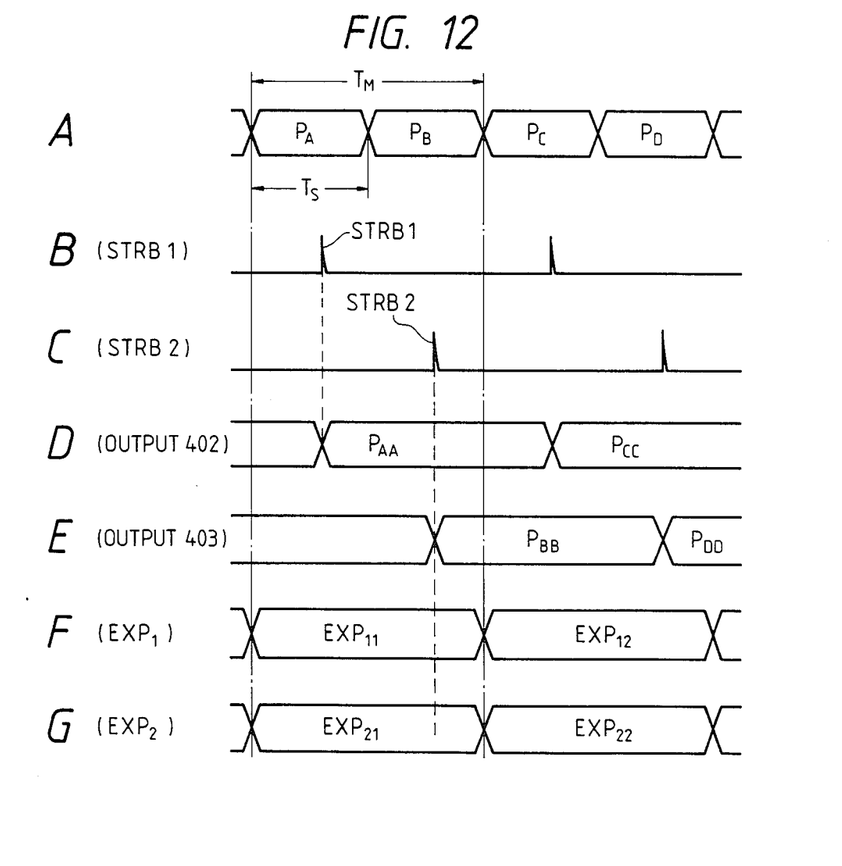
FIG. 12 is a waveform diagram, for explaining another mode of operation of the present invention.

Furthermore, since either of the expected value signals EXP$_1$ and EXP$_2$ can be applied to either one of the two logical comparators 401A and 401B in each of the channels CH$_1$ and CH$_2$, signals detected by the two strobe pulses STRB 1 and STRB 2 can be separately compared by the logical comparators 401A and 401B in the same channel. Accordingly, even if the cycle period T$_S$ of the response signal from the circuit under test is ½ of one test cycle T$_M$ of the testing apparatus, for example, as shown in FIG. 12, it is possible to detect the presence or absence of respective data P$_A$, P$_B$, P$_C$, ... by the strobe pulses STRB 1 and STRB 2 alternately with each other and compare the detected signals P$_{AA}$, P$_{CC}$, ... and P$_{BB}$, P$_{DD}$, ... (see FIGS. 12D and 12E) by the logical comparators 401A and 401B separately of each other. This is essentially equivalent to operating the circuit testing apparatus at a twice higher speed.

According to the conventional pin multiplex system intended for such an operation, the number of circuits which can be tested at one time is ½ the number of channels, because logical comparators provided in two channels are used for the logical comparison of one output response signal. In contrast thereto, according to the present invention, a pair of signal detectors and a pair of logical comparators are provided in each channel and the independent strobe pulses STRB 1 and STRB 2 are applied to the two signal detectors 402 and 403 for the signal detection, so that one circuit can be tested at high speed for each channel with no substantial enlargement of the circuit scale of the entire apparatus.

Moreover, according to the present invention, since mask data read out of the plurality of storage areas 600A to 600D can be selectively applied to the two logical comparators 401A and 401B provided in each of the channels CH$_1$, CH$_2$, CH$_3$, ..., a plurality of classifications can be effected by one test. The prior art requires four tests for classifying memory cells which do not meet the test conditions b, c and d as described previously. According to the present invention, the same classification can be achieved by two tests as described below.

The two signal detectors 402 and 403 and the two logical comparators 401A and 401B are provided in each of the channels CH₁, CH₂, CH₃, ... and mask data read out of the different storage areas 600A to 600D can be provided to the two logical comparators 401A and 401B.

Figure 13:
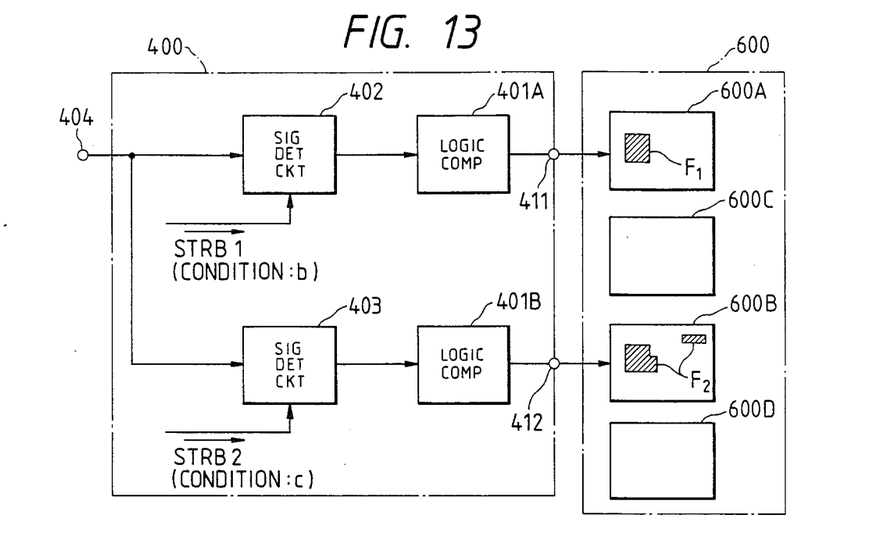
FIGS. 13 and 14 are block diagrams, for explaining still another mode of operation of the present invention.

In a first test, the response signal from the memory under test is tested on the side of the signal detector 402 under the condition b on the side of the signal detector 403 under the condition c by suitably setting the timing of the strobe pulses STRB 1 and STRB 2 as shown in FIG. 13. The test results can be stored in the storage areas 600A to 600D of the failure analysis memory 600, respectively. Reference characters $F_1$ and $F_2$ indicate failure storage areas for the memory cells which did not meet the test conditions b and c.

Figure 14:
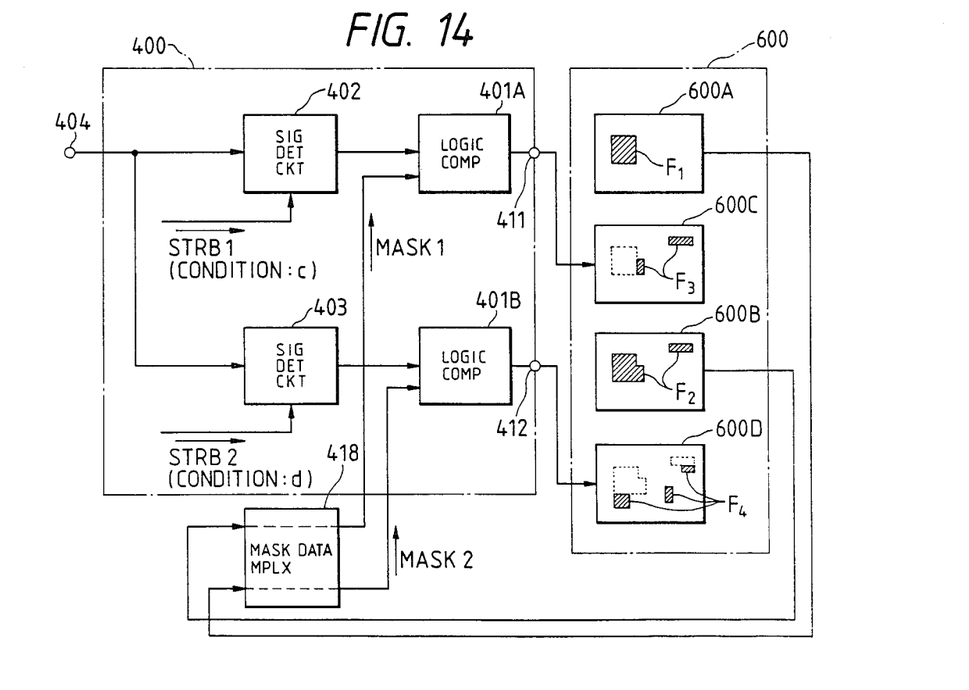

In a second test, as shown in FIG. 14, inverted outputs of the test results on the conditions b and c, stored in the storage areas 600A and 600B of the failure analysis memory 600, are read out as mask data MASK 1 and MASK 2, which are provided to the logical comparators 401A and 401B via the mask data multiplexer 418. At the same time, the timing of the strobe pulse STRB 1 which is applied to the signal detector 402 is set to the test condition c and the timing of the strobe pulse STRB 2 which is applied to the signal detector 403 is set to the test condition d. Response signals detected by the tests under the conditions c and d are applied to the logical comparators 401A and 401B. The logical comparators 401A and 401B perform the logical comparison of the detected response signals while using, as the mask data MASK, the inverted outputs of the test results on the conditions b and c read out of the storage areas 600A and 600B, and the test results are written into the storage areas 600C and 600D of the failure analysis memory 600.

The data thus written into the storage area 600C are data about the memory cells which met the condition b but did not meet the condition c, and the data are stored in the failure area $F_3$. The data written into the storage area 600D are data about the memory cells which met the condition c but did not meet the condition d, and the data are stored in the failure area $F_4$. In the storage area 600A there are stored data on the positions of the memory cells which did not meet the test condition b and in the storage area 600B there are stored data on the positions of the memory cells which did not meet the test condition c. In this way, the memory can be tested for four kinds of conditions by two tests.

Figure 15:
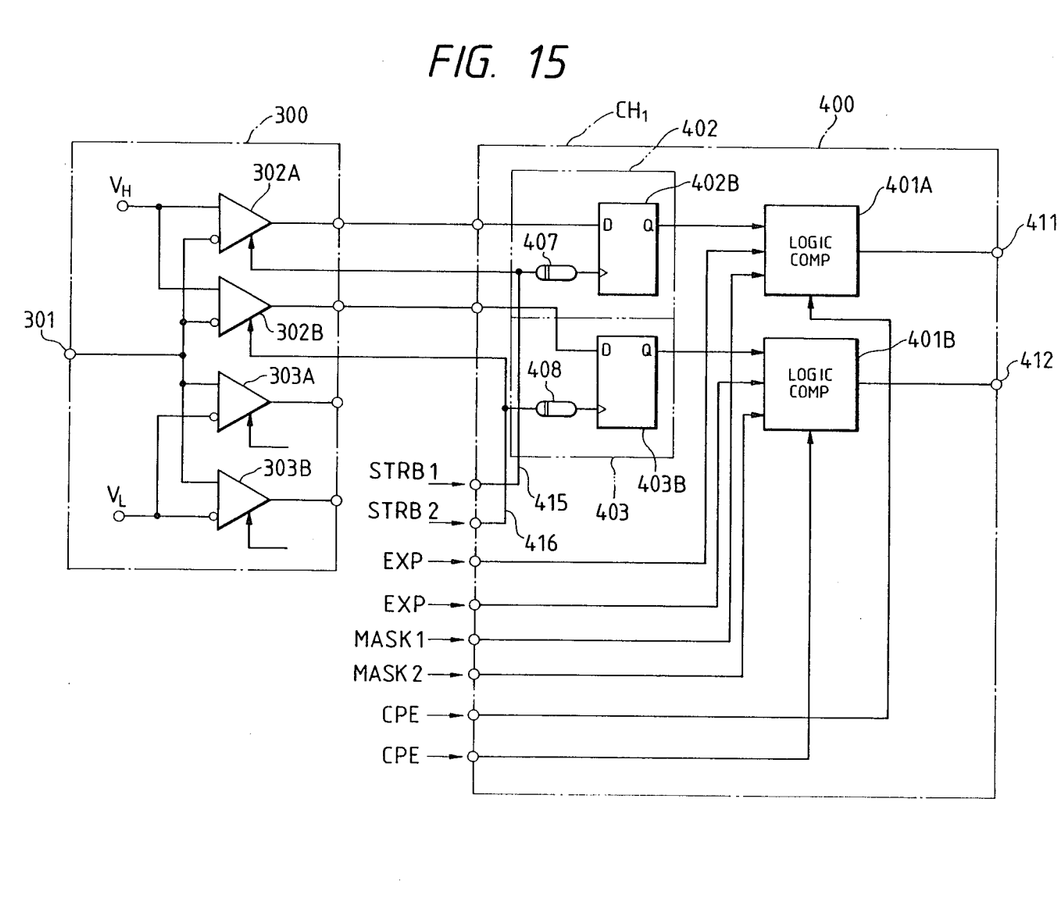
FIG. 15 is a block diagram of a modification of the present invention.

FIG. 15 illustrates a modified form of the embodiment depicted in FIG. 10. In FIG. 15 there are shown only the level comparison section 300 in FIG. 10 and the corresponding logical comparison section 400 of the channel CH₁, the other parts being not shown because they are identical with those in FIG. 10. In this embodiment, comparators 302A, 302B, 303A and 303B having the holding function, identical with those employed in FIG. 2, are used in the level comparison section 300. The corresponding inputs of the comparators 302A and 302B which define the H-logic level are interconnected, and the strobe pulses STRB 1 and STRB 2 are applied to the comparators 302A and 302B via the different signal lines 415 and 416, respectively. The comparators 303A and 303B which define the L-logic level are also similarly connected.

The outputs of the comparators 302A and 302B are applied to the signal detectors 402 and 403 in the logical comparison section 400, respectively. In this embodiment, the signal detectors 402 and 403 are formed by D-type flip-flops 402B and 403B, respectively. The D-type flip-flops 402B and 403B are supplied at their data input terminals D with the level comparison results by the comparators 302A and 302B and latch them in response to the strobe pulses STRB 1 and STRB 2 delayed by the delay circuits 407 and 408. The other arrangements are identical with those of the embodiment shown in FIG. 10. Since this embodiment is also arranged so that the response signal from a circuit under test is detected in response to the strobe signals STRB 1 and STRB 2 provided via the different signal lines 415 and 416 and subjected to the logical comparison, the two strobe pulses STRB 1 and STRB 2 can freely be set at close timing.

As described above, according to the present invention, since the plurality of signal detectors 402 and 403 are provided in each channel and supplied with the strobe pulses STRB 1 and STRB 2 via the different strobe signal lines 415 and 416, the time interval between the strobe pulses STRB 1 and STRB 2 can be reduced even to zero for signal detection. Accordingly, the rise-up timing of the response output of a sharp rise, which is yielded from a quick response type circuit, can be detected with high resolution, and the distribution of response speeds can be classified into a plurality of kinds by one test.

In addition, according to the present invention, the detected signals from the two signal detectors 402 and 403, which operate on the independent strobe pulses STRB 1 and STRB 2 in each channel, can be compared separately by the two logical comparators, and further either one of the two logical comparators can be supplied with a selected one of the expected value signal, for example, EXP₁ of the channel and the expected value signal EXP₂ of the adjoining channel via the signal switching signal 417A or 417B.

Consequently, even if the circuit under test outputs a response signal of a frequency twice higher than the test cycle of the testing apparatus in the above-mentioned embodiments, it is possible to detect two response outputs in one test cycle by the signal detectors 402 and 403 separately of each other and compare the detected results by the logical comparators 401A and 401B independently of each other. Accordingly, even if logical comparators of two channels are not used as in the conventional pin multiplex system, the test can be made at a speed twice higher than in the conventional system; the time for the test can be reduced accordingly.

Besides, according to the present invention, test results which are concurrently read out of two desired storage areas of the failure analysis memory 600 can be selectively provided as mask data to either of the two logical comparators 401A and 401B of each channel by means of the mask data multiplexer 418. Therefore, mask data can be provided separately to the two logical comparators in each channel, so that circuits under test can be classified for two conditions by one test. This also affords the reduction of the test time.

It will be apparent that many modifications and variations may be effected without departing from the scope of the novel concepts of the present invention.

What is claimed is:

1. A circuit testing apparatus having a plurality of test channels, in each of which a test signal is applied to a circuit under test, the circuit under test producing an output response signal which is compared with an expected value signal to detect coincidence or noncoincidence between them so as to determine whether the circuit under test is good or bad, said apparatus comprising:
a plurality of signal detecting means, each of which compares, at arbitrary timing, the output response signal with a reference level defining a normal logical level, to decide whether or not the output response signal is at the normal logical level, and which holds and outputs the decided logical level;
a plurality of independent strobe signal lines, coupled to said plurality of signal detecting means, through which strobe pulses for determining the timing for the level comparison are applied to said plurality of signal detecting means individually; and
a plurality of logical comparison means which are supplied with the decided logical levels from said plurality of signal detecting means, for comparing the decided logical levels with the expected value signal to detect coincidence or noncoincidence therebetween.

2. The apparatus of claim 1, wherein each test channel further includes expected value signal switching means for selecting and applying an arbitrary one of a plurality of expected value signals to at least one of said plurality of logical comparison means.

3. The apparatus of claim 2, wherein each of said plurality of signal detecting means includes:
level comparing means for comparing the output response signal from the circuit under test with the reference level and providing an output; and
at least two signal detected output holding means, connected to the output of said level comparing means, for loading therein and holding the compared output in response to each of the strobe pulses supplied via the plurality of strobe signal lines, and wherein the number of said plurality of logical comparison means is at least two.

4. The apparatus of claim 3, wherein said level comparing means includes:
an H level comparator for comparing the output response signal with an H reference level defining a normal H logical level; and
an L level comparator for comparing the output response signal with an L reference level defining a normal L logical level, and wherein said at least two detected signal output holding means and said two logical comparison means are provided for each of said H level comparator and said L level comparator.

5. The apparatus of claim 2, wherein each of said plurality of signal detecting means includes at least two level comparators, each responding to one of the strobe pulses to compare the output response signal from the circuit under test with the reference level and to hold and output the comparison result.

6. The apparatus of claim 2, wherein each of said plurality of logical comparison means includes gate means, responsive to a compare enable signal, for effecting control for determining whether or not the comparison result is output by said logical comparison means.

7. The apparatus of claim 6, further comprising compare enable signal switching means for selecting and applying an arbitrary one of a plurality of compare enable signals to each of said gate means of each of said plurality of logical comparison means.

8. The apparatus of claim 1, wherein each test channel further includes:
failure analysis memory means having a plurality of storage areas for storing test results from said plurality of logical comparison means; and
mask data multiplexing means for selectively providing the test results read out of said plurality of storage areas as mask data to a desired one of said plurality of logical comparison means.

9. The apparatus of claim 8, wherein each of said plurality of signal detecting means includes:
level comparing means for comparing the output response signal from the circuit under test with the reference level and providing an output; and
at least two signal detected output holding means, connected to the output of said level comparing means, for loading therein and holding the compared output in response to each of the strobe pulses supplied via the plurality of strobe signal lines, and wherein the number of said plurality of logical comparison means is at least two.

10. The apparatus of claim 9, wherein said level comparing means includes:
an H level comparator for comparing the output response signal with an H reference level defining a normal H logical level; and
an L level comparator for comparing the output response signal with an L reference level defining a normal L logical level, and wherein said at least two detected signal output holding means and said two logical comparison means are provided for each of said H level comparator and said L level comparator.

11. The apparatus of claim 8, wherein each of said plurality of signal detecting means includes at least two level comparators, each responding to one of the strobe pulses to compare the output response signal from the circuit under test with the reference level and to hold and output the comparison result.

12. The apparatus of claim 8, wherein each of said plurality of logical comparison means includes gate means, responsive to a compare enable signal, for effecting control for determining whether or not the comparison result is output by said logical comparison means.

13. The apparatus of claim 12, further comprising compare enable signal switching means for selecting and applying an arbitrary one of a plurality of compare enable signals to each of said gate means of each of said plurality of logical comparison means.

14. The apparatus of claim 1, wherein each of said plurality of signal detecting means includes:
level comparing means for comparing the output response signal from the circuit under test with the reference level and for providing an output; and
at least two signal detected output holding means, connected to the output of said level comparing means, for loading therein and holding the compared output in response to each of the strobe pulses supplied via the plurality of strobe signal lines, and wherein the number of said plurality of logical comparison means is at least two.

15. The apparatus of claim 14, wherein said level comparing means includes:
an H level comparator for comparing the output response signal with an H reference level defining a normal H logical level; and
an L level comparator for comparing the output response signal with an L reference level defining a normal L logical level, and wherein said at least two detected signal output holding means and said two logical comparison means are provided for each of said H level comparator and said L level comparator.

16. The apparatus of claim 1, wherein each of said plurality of signal detecting means includes at least two level comparators, each responding to one of the strobe pulses to compare the output response signal from the circuit under test with the reference level and to hold and output the comparison result.

17. The apparatus of claim 1, wherein each of said plurality of logical comparison means includes gate means, responsive to a compare enable signal, for effecting control for determining whether or not the comparison result is output by said logical comparison means.

18. The apparatus of claim 17, further comprising compare enable signal switching means for selecting and applying an arbitrary one of a plurality of compare enable signals to each of said gate means of each of said plurality of logical comparison means.

* * * * *